(12) United States Patent
Wang et al.

(10) Patent No.: US 9,773,684 B2
(45) Date of Patent: Sep. 26, 2017

(54) METHOD OF MANUFACTURING FAN OUT WAFER LEVEL PACKAGE

(71) Applicant: National Center for Advanced Packaging Co., Ltd., Wuxi, Jiangsu Province (CN)

(72) Inventors: Hongjie Wang, Wuxi (CN); Yibo Liu, Wuxi (CN); Feng Chen, Wuxi (CN); Dongkai Shangguan, Wuxi (CN); Peng Sun, Wuxi (CN)

(73) Assignee: National Center for Advanced Packaging Co., Ltd., Wuxi (CN)

( * ) Notice: Subject to any disclaimer, the term of this patent is extended or adjusted under 35 U.S.C. 154(b) by 0 days.

(21) Appl. No.: 14/927,199

(22) Filed: Oct. 29, 2015

(65) Prior Publication Data

US 2016/0218020 A1   Jul. 28, 2016

(30) Foreign Application Priority Data

Jan. 27, 2015   (CN) .......................... 2015 1 0042106

(51) Int. Cl.
*H01L 21/56* (2006.01)
*H01L 23/00* (2006.01)
*H01L 23/482* (2006.01)
*H01L 21/683* (2006.01)
*H01L 23/31* (2006.01)

(52) U.S. Cl.
CPC ........ *H01L 21/561* (2013.01); *H01L 21/6835* (2013.01); *H01L 23/3114* (2013.01); *H01L 23/482* (2013.01); *H01L 24/19* (2013.01); *H01L 24/96* (2013.01); *H01L 24/97* (2013.01); *H01L 21/568* (2013.01); *H01L 2221/68372* (2013.01); *H01L 2224/12105* (2013.01); *H01L 2924/18162* (2013.01); *H01L 2924/3511* (2013.01)

(58) Field of Classification Search
CPC . H01L 21/561; H01L 21/6835; H01L 21/568; H01L 24/19; H01L 24/97; H01L 24/96
See application file for complete search history.

(56) References Cited

U.S. PATENT DOCUMENTS

| | | | | |
|---|---|---|---|---|
| 2009/0087951 | A1* | 4/2009 | Jeon | ..................... H01L 21/6835 438/118 |
| 2010/0052164 | A1* | 3/2010 | Lee | ..................... H01L 23/3114 257/738 |
| 2010/0133680 | A1* | 6/2010 | Kang | ..................... H01L 21/56 257/692 |
| 2012/0286408 | A1* | 11/2012 | Warren | ............... H01L 21/4832 257/673 |

* cited by examiner

*Primary Examiner* — Benjamin Sandvik
*Assistant Examiner* — Farid Khan
(74) *Attorney, Agent, or Firm* — Zareefa B. Flener; Flener IP Law

(57) ABSTRACT

A method of manufacturing a fan out wafer level package comprises: preparing conductive projections on an upper surface of a chip; mounting the chip on a carrier with the upper surface of the chip facing upwards; plastic packaging the chip to form a plastic packaging body with tops of the conductive projections being disposed outside the plastic package body; and implementing a redistribution line processing on the plastic package body. With this method, chips can be made small and thin and the manufacturing processes can be simplified.

6 Claims, 6 Drawing Sheets

METHOD OF MANUFACTURING FAN OUT WAFER LEVEL PACKAGE

CROSS-REFERENCE TO RELATED APPLICATIONS

The present application claims priority under 35 U.S.C. §119 to Chinese Patent Application No. 201510042106.2, filed on Jan. 27, 2015, in the State Intellectual Property Office of China, and entitled "Method of Manufacturing Fan Out Wafer Level Package", which is incorporated by reference herein in its entirety.

TECHNICAL FIELD

Aspects of the present disclosure relate to semiconductor packaging, and more particularly to a method of manufacturing a fan out wafer level package.

BACKGROUND

Fan Out Wafer Level Package (FOWLP) is a technique for packaging embedded chips based on wafer level processing. As an advanced packaging technique which can provide a plurality of input/output ports (I/Os) and good integration flexibility, it has been widely used in the field of semiconductor packaging.

SUMMARY

Embodiments of the present invention are directed to a method of manufacturing a fan out wafer level package which is applicable to small and thin chips and can simplify the manufacturing processes.

According to an embodiment of the present invention, a method of manufacturing a fan out wafer level package includes: preparing conductive projections on an upper surface of a chip; mounting the chip on a carrier with the upper surface of the chip facing upwards; plastic packaging the chip to form a plastic packaging body with tops of the conductive projections being disposed outside the plastic package body; and implementing a redistribution line processing on the plastic package body.

In the method of manufacturing a fan out wafer level package according to this embodiment of the present invention, when a chip is plastic packaged, firstly conductive projections will be formed on the upper surface of the chip and the plastic packaging will be made with the conductive projections being exposed. Accordingly, an additional process of polishing the plastic package body to expose the conductive projections in the prior art may be omitted, which can lead in fast and simple interconnection between the conductive projections and the redistribution line layer and thus simplifies the manufacturing processes. Furthermore, since the conductive projections are higher than conductive bumps in the prior art, the process of exposing the conductive projections is easy to implement, which reduces difficulty of processing.

BRIEF DESCRIPTION OF DRAWINGS

These and/or other aspects will become apparent and more readily appreciated from the following description of the embodiments, taken in conjunction with the accompanying drawings in which.

DETAILED DESCRIPTION

Figure 1:
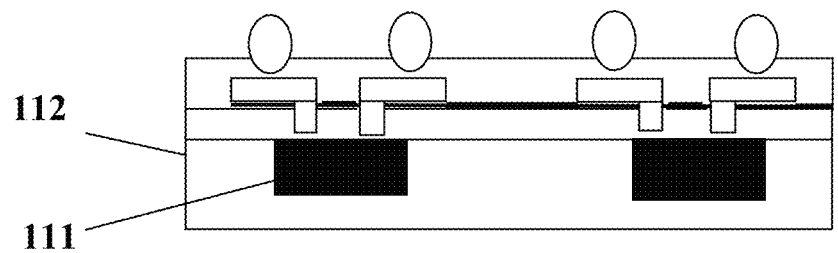
FIG. 1 schematically shows a package in which conductive electrodes of a chip face downwards according to prior art.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween.

FIG. 1 schematically shows a package in which conductive electrodes of a chip face downwards according to prior art. As shown in FIG. 1, in this method of manufacturing of a fan out wafer level package, a chip 111 is mounted to a carrier with the upper surface facing downwards, and then the chip 111 is packaged in a plastic package body 112. Since the upper surface of the chip 111 faces toward the carrier after being plastic packaged, the carrier should be flipped over 180° after plastic packaging, and then coating and the carrier should be removed to expose the conductive electrodes on the upper surface of the chip 111 in order to perform redistribution line processing. Therefore, the chip is made thick in order to prevent buckling of the plastic package body after the carrier is removed, resulting in difficulty of the next redistribution line processing.

Figure 2:
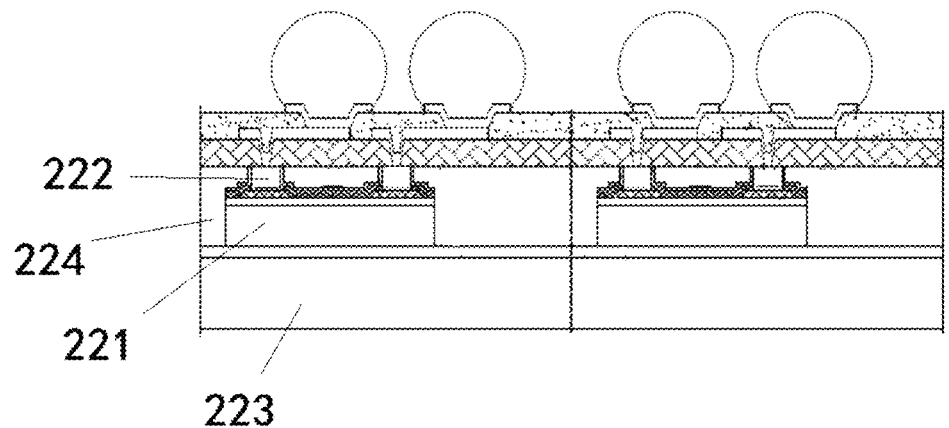
FIG. 2 schematically shows a package in which conductive electrodes of a chip face upwards according to prior art.

FIG. 2 schematically shows a package in which conductive electrodes of a chip face upwards according to prior art. As shown in FIG. 2, in this method of manufacturing of a fan out wafer level package, conductive projections 222 are formed on the upper surface of a chip 221, and then the chip 221 is mounted to a carrier 223 with the upper surface facing upwards, finally the chip 221 is plastic packaged into a plastic package body 224. After that, the plastic package body 224 is polished so that the conductive projections 222 are exposed, and then redistribution line processing is implemented to form a pad pattern and balls are planted thereon. According to this method, since conductive projections are not exposed outside the plastic package body initially, an additional process of polishing the plastic package body to draw I/O out is required, resulting in increase of manufacturing costs.

Accordingly, there is a desire to provide a method of manufacturing a fan out wafer level package which can provide small and thin chips and can simplify the manufacturing processes.

Thereinafter, a flowchart illustrating a method of manufacturing a fan out wafer level package according to an embodiment of the present invention will be described in detail with reference to FIG. 3.

Figure 3:
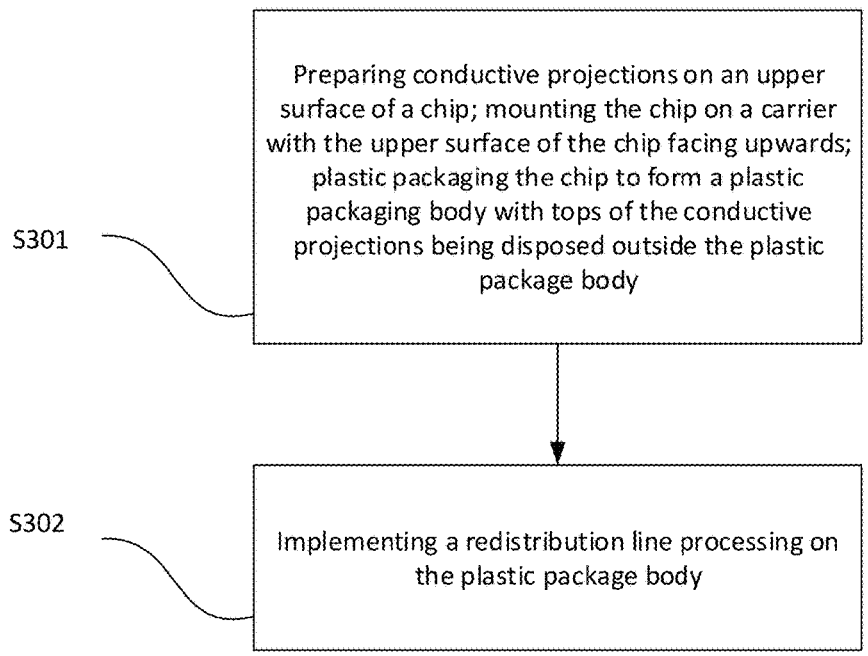
FIG. 3 is a flowchart illustrating a method of manufacturing a fan out wafer level package according to an embodiment of the present invention.

As shown in FIG. 3, at step S301, conductive projections are prepared on an upper surface of a chip, and then the chip is mounted on a carrier with the upper surface thereof facing upwards, this is, the upper surface is far away from the carrier. After that, the chip is plastic packaged, with tops of the conductive projections being disposed outside the plastic package.

The chip is made through thinning and cutting a semiconductor wafer. The upper surface refers to the surface of the chip on which conductive electrodes which are drawn from internal circuits installed inside the chip are located. The conductive projections are prepared on the conducive electrodes respectively. The conductive projections may be prepared through various methods, such as electroplating, studding or ball planting. And the conductive projections may be made of metal materials, such as one selected from Au, Ag, Cu, Sn, Pb, Bi, Al, Cr, Ni and alloy thereof.

As understood by those skilled in the art, the conductive projections which are located on the upper surface of the chip may be prepared on the semiconductor wafer and then the semiconductor wafer is cut to form separate chips having the conductive projections. Alternatively, the semiconductor wafer may be cut to form separate chips, and then the conductive projections are prepared on the upper surface of a separate chip after the chip is plastic packaged. The present invention is not limited thereto.

The carrier may have a circular shape or a rectangular shape, etc. The present invention is not limited thereto. In the case that the conductive projections are prepared before the chip is plastic packaged, they may be prepared after the chip is mounted on the carrier.

In addition, the carrier may be removed after redistribution line process, or just after the plastic packaging is completed. Alternatively, the carrier may be left, rather than being removed, in order to improve thermal and mechanical properties of the chip. The present invention is not limited thereto.

In an embodiment of the present invention, plastic packaging for the chip may be made using a molding method, a printing method or a hot press method. In detail, plastic packaging material is coated on the carrier using a molding method, a printing method or a hot process method to cover the chip and bottoms of the conductive projections while expose tops of the conductive projections. The exposed tops of the conductive projections are connected to a redistribution line layer so as to act as a current path.

At step S302, a redistribution line processing is implemented on the plastic package body from which the conductive projections are exposed, thereby completing the method of manufacturing a fan out wafer level package.

In detail, firstly, a conductive seed layer is prepared on the plastic package body and exposed portions of the conductive projections.

Secondly, a redistribution line metal layer pattern is formed on the conductive seed layer with a photoresist mask using photolithography.

Next, electroplating is implemented on the photoresist mask to fill blank portions of the photoresist mask.

After that, the photoresist make is removed to form a redistribution line metal layer having pads.

Then a solder resist layer is prepared on the redistribution line metal layer, with the pads on the redistribution line metal layer being exposed.

Finally, solder balls are prepared on the pads so as to form a final package.

Figure 4:
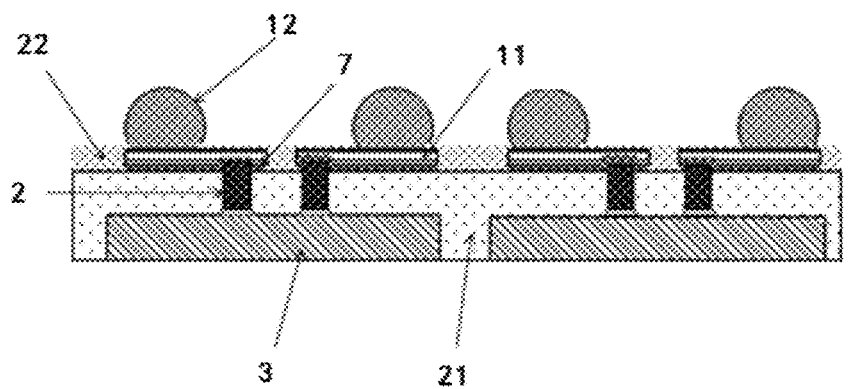
FIG. 4 schematically shows a package manufactured with a method of manufacturing a fan out wafer level package according to an embodiment of the present invention.

FIG. 4 schematically shows a package manufactured with a method of manufacturing a fan out wafer level package according to the embodiment described above. As shown in FIG. 4, the package includes two chips 3, and two conductive projections 2 are prepared on the upper surface of each chip 3. Although the two chips 3 are packaged in the plastic package body made of plastic material 21 with the upper surfaces facing upwards, the tops of the conductive projections 2 located on the upper surface of each chip 3 are exposed outside the plastic package body. The four exposed tops of conductive projections 2 are connected to pads 11 through the conductive seed layer 7 respectively, and a solder ball 12 is soldered to each pad. The gap between the four pads 11 is filled with solder resist material 22.

Figure 5:
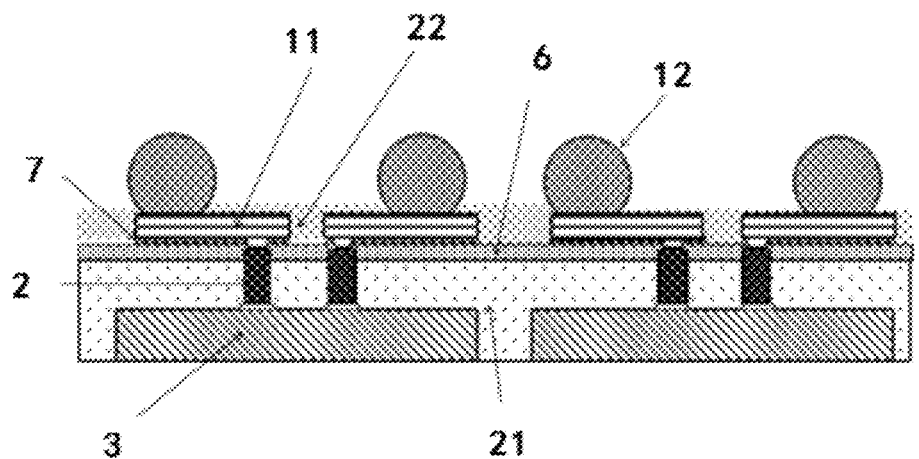
FIG. 5 schematically shows a package manufactured with a method of manufacturing a fan out wafer level package according to another embodiment of the present invention.

In another embodiment of the invention, in order to makes the packages compact, a dielectric layer 6 may be prepared on the plastic package body and the exposed conductive projections 2 in advance. Then photolithograph is implemented to expose the tops of the conductive projections 2 outside the dielectric layer. Next, the conductive seed layer 7 is prepared on the dielectric layer 6 and the conductive projections 2. FIG. 5 schematically shows a package manufactured with a method of manufacturing a fan out wafer level package according to this embodiment. As shown in FIG. 5, unlike the package shown in FIG. 4, the dielectric layer 6 is further included between the conductive seed layer 7 and the surface of the plastic package body. An opening which corresponds to each conductive projection 2 and is made using photolithograph is disposed in the dielectric layer 6. And each conductive projection 2 is connected to the conductive seed layer 7 through the opening.

It is understood to those skilled in the art that a plurality of chips may be mounted on one carrier. In this case, a package including a plurality of chips may be cut into a plurality of packages which each include a separate chip. Thus there is no limit on amounts of chips mounted on one carrier in the methods according to the present invention.

Detailed steps of a method of manufacturing a fan out wafer level package according to an embodiment of the present invention will be described with reference to FIGS. 6a-6n.

Figure 6A:
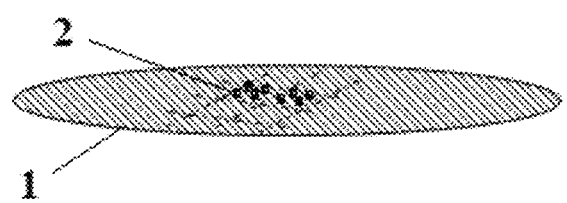
FIGS. 6a-6n schematically shows each step of a method of manufacturing a fan out wafer level package according to an embodiment of the present invention.

Firstly, as shown in FIG. 6a, chip dividing lines (shown in broken line) are determined on a bare wafer 1, and conductive projections 2 are prepared on the wafer 1.

Figure 6B:
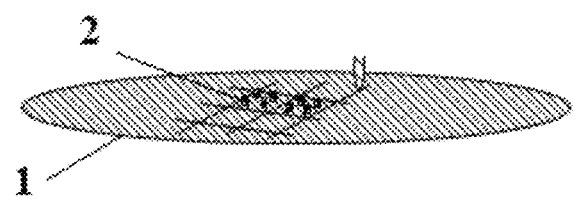

Secondly, as shown in FIG. 6b, the wafer 1 is thinning so as to form a chip 3 having the conductive projections 2.

Figure 6C:
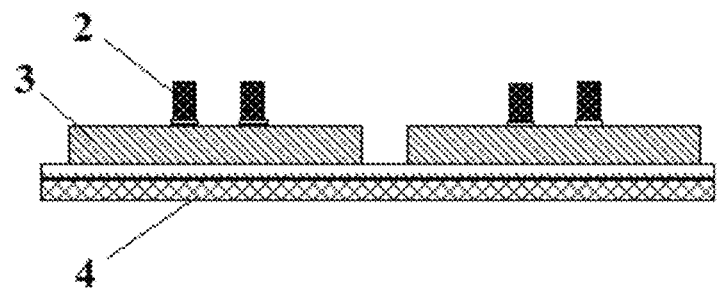

Next, as shown in FIG. 6c, the chip 3 having the conductive projections 2 is mounted on a carrier 4 with the upper surface thereof facing upwards.

Figure 6D:
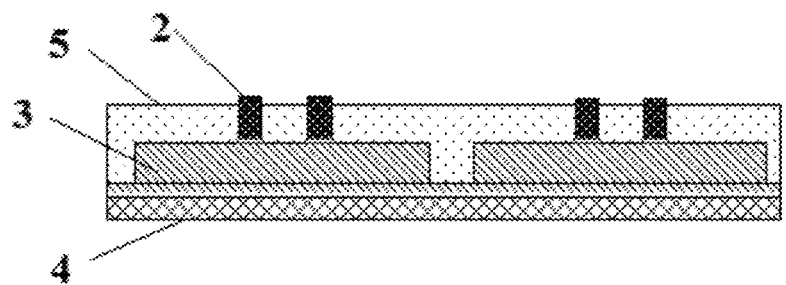

As shown in FIG. 6d, the chip 3 is plastic packaged to form a plastic package body 5, with tops of the conductive projections 2 being exposed outside the plastic package body 5.

Figure 6E:
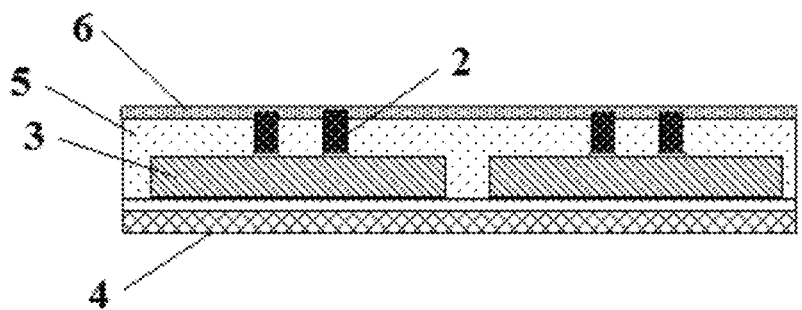

As shown in FIG. 6e, a dielectric layer 6 is prepared on the plastic package body 5 and the tops of the conductive projections 2.

Figure 6F:
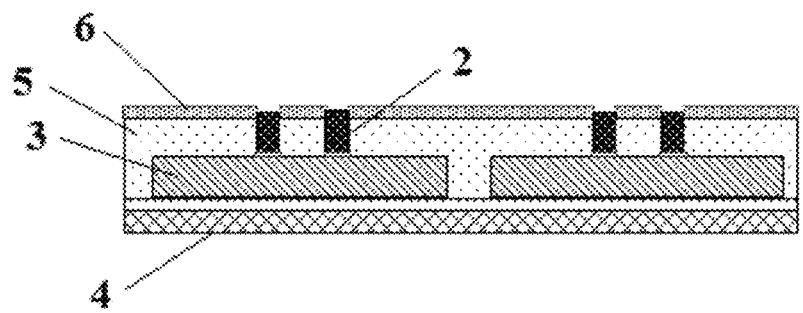

As shown in FIG. 6f, the conductive projections 2 are exposed outside the dielectric layer 6 using photolithography.

Figure 6G:
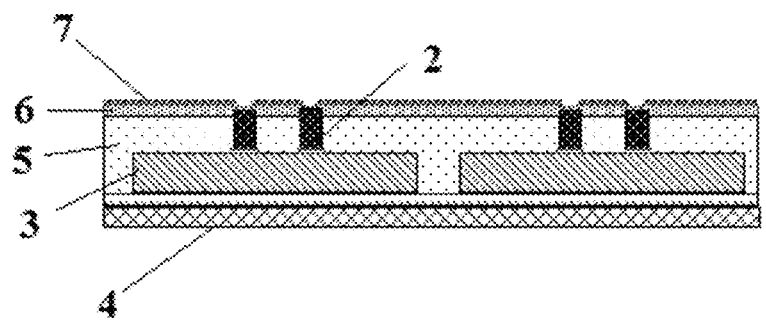

As shown in FIG. 6g, a conductive seed layer 7 is prepared on the dielectric layer 6 and the exposed conductive projections 2.

Figure 6H:
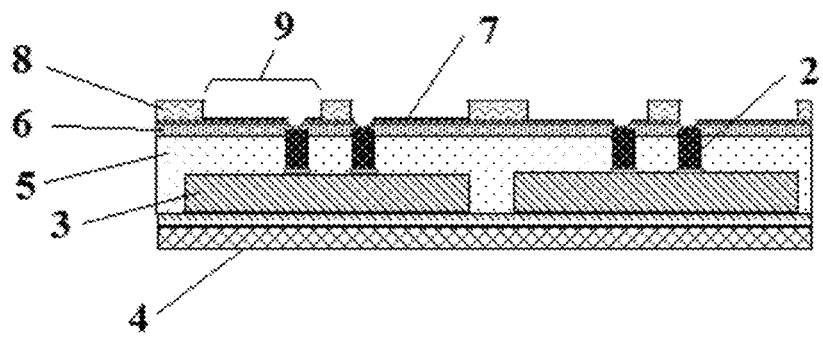

As shown in FIG. 6h, a redistribution line pattern is formed with a photoresist mask 8 on the conductive seed layer 7 using photolithography. Here, the exposed blank portion 9 of the photoresist mask 8 indicates the position where pads will be formed.

Figure 6I:
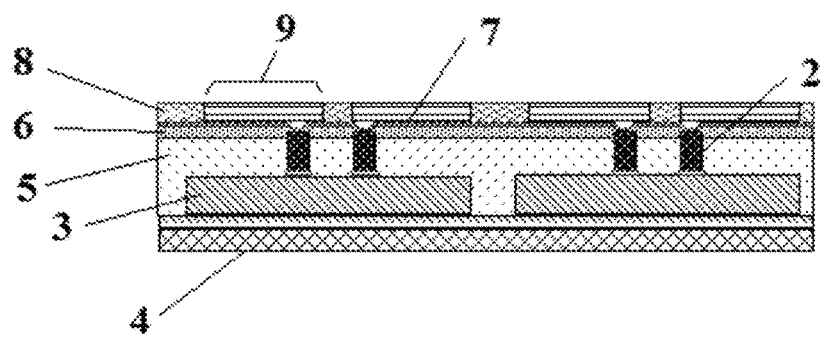

As shown in FIG. 6i, the exposed blank portion 9 of the photoresist mask 8 is filled with a conductive material.

Figure 6J:
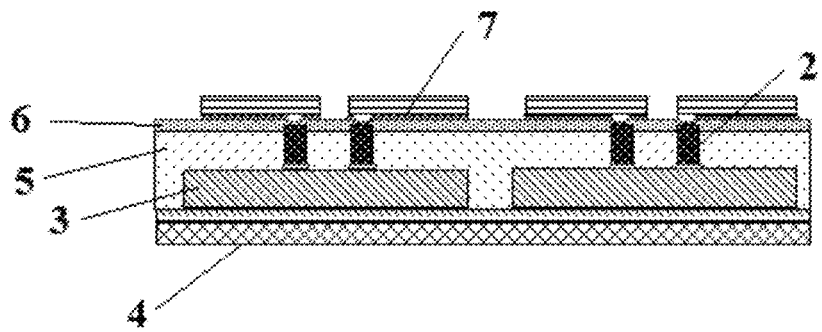

As shown in FIG. 6j, the photoresist mask 8 is removed and the conductive seed layer 7 is remained.

Figure 6K:
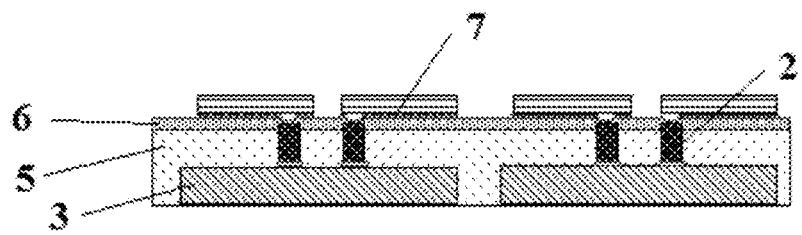

As shown in FIG. 6k, the carrier 4 on which the chip 3 is mounted is removed.

Figure 6L:
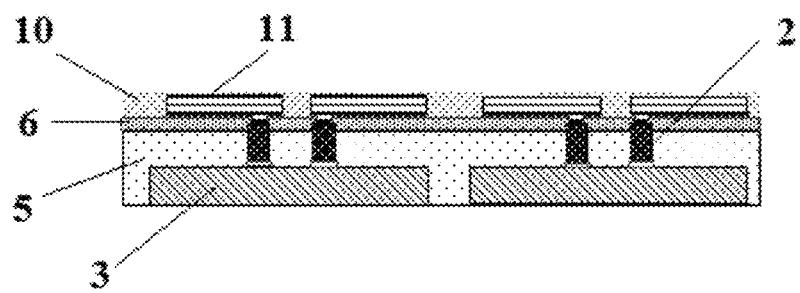

As shown in FIG. 6l, a solder resist layer 10 is prepared, with only the blank portion 9 of the photoresist mask 8 which has been filled with the conductive material being not covered so that the pads 11 can be mounted thereon. That is, the positions corresponding to the pads 11 is not covered by the solder resist layer 10.

Figure 6M:
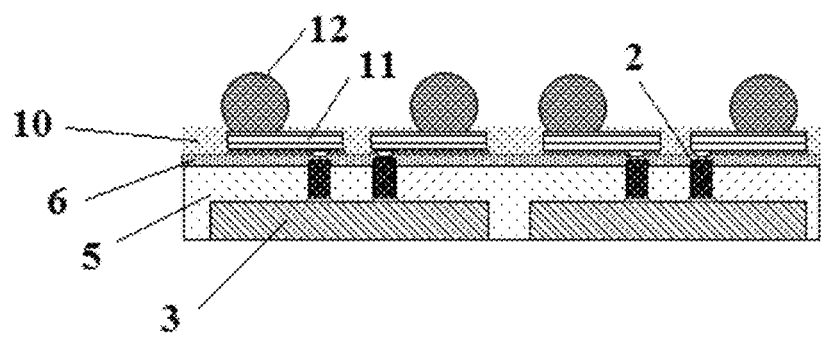

As shown in FIG. 6m, solder balls 12 are prepared on the pads 11 respectively.

Figure 6N:
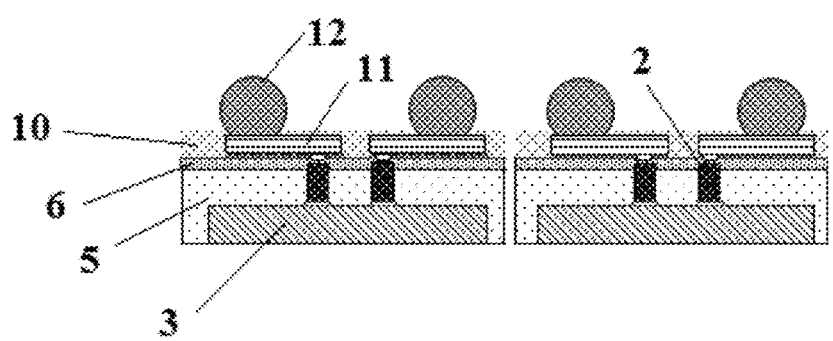

Finally, as shown in FIG. 6n, the package is cut into a plurality of packages which each include a separate chip 3.

In methods of manufacturing a fan out wafer level package according to embodiments of the present invention, when a chip is plastic packaged, firstly conductive projections will be formed on the upper surface of the chip and the plastic packaging will be made with the conductive projections being exposed. Accordingly, an additional process of polishing the plastic package body to expose the conductive projections in the prior art may be omitted, which can lead in fast and simple interconnection between the conductive projections and the redistribution line layer and thus simplifies the manufacturing processes. Furthermore, since the conductive projections are higher than conductive bumps in the prior art, the process of exposing the conductive projections is easy to implement, which reduces difficulty of processing.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A method of manufacturing a fan out wafer level package, comprising:
    preparing conductive projections on an upper surface of a chip;
    mounting the chip on a carrier with the upper surface of the chip facing upwards;
    plastic packaging the chip to form a plastic packaging body with tops of the conductive projections being disposed outside the plastic package body; and
    implementing a redistribution line processing on the plastic package body, wherein the step of implementing a redistribution line processing includes:
        preparing a dielectric layer on the plastic package body and the exposed conductive projections;
        implementing photolithography on the dielectric layer to expose the conductive projections;
        preparing a conductive seed layer on the plastic package body and exposed portions of the conductive projections;
        forming a redistribution line metal layer pattern on the conductive seed layer with a photoresist mask using photolithography;
        implementing electroplating on the photoresist mask to fill blank portions of the photoresist mask;
        removing the photoresist mask to form a redistribution line metal layer having pads;
        preparing a solder resist layer on the redistribution line metal layer, with the pads on the redistribution line metal layer being exposed; and
        preparing solder balls on the pads.

2. The method according to claim 1, wherein the conductive projections are prepared through electroplating, studding or ball planting.

3. The method according to claim 1, wherein the conductive projections are made of one selected from Au, Ag, Cu, Sn, Pb, Bi, Al, Cr, Ni and alloy thereof.

4. The method according to claim 1, further comprising removing the carrier after the step of plastic packaging the chip.

5. The method according to claim 1, wherein the carrier has a circular shape or a rectangular shape.

6. The method according to claim 1, wherein the chip is plastic packaged using a molding method, or a printing method, or a hot process method.

* * * * *